(12) United States Patent
Kang et al.

(10) Patent No.: US 12,453,238 B2
(45) Date of Patent: Oct. 21, 2025

(54) DISPLAY APPARATUS

(71) Applicant: Samsung Display Co., Ltd., Yongin-Si (KR)

(72) Inventors: Chulkyu Kang, Yongin-si (KR); Hyunchol Bang, Yongin-si (KR); Jintae Jeong, Yongin-si (KR); Sujin Kim, Yongin-si (KR); Seonkyoon Mok, Yongin-si (KR); Hyunji Cha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 542 days.

(21) Appl. No.: 17/982,314

(22) Filed: Nov. 7, 2022

(65) Prior Publication Data

US 2023/0269961 A1 Aug. 24, 2023

(30) Foreign Application Priority Data

Feb. 22, 2022 (KR) .......................... 10-2022-0023130

(51) Int. Cl.
*H10K 50/844* (2023.01)
*H10K 59/131* (2023.01)

(52) U.S. Cl.
CPC .......... *H10K 50/844* (2023.02); *H10K 59/131* (2023.02)

(58) Field of Classification Search
CPC .... G06F 1/1637; G06F 1/1626; G06F 1/1656; H10K 50/841; H10K 59/124
See application file for complete search history.

(56) References Cited

U.S. PATENT DOCUMENTS

| | | | |
|---|---|---|---|
| 10,529,782 B2 | 1/2020 | Shin et al. | |
| 11,275,476 B2 | 3/2022 | Bang et al. | |
| 2009/0167155 A1 | 7/2009 | Kwak | |
| 2012/0161197 A1 | 6/2012 | Im et al. | |
| 2020/0091256 A1* | 3/2020 | Kim | H10K 77/111 |

FOREIGN PATENT DOCUMENTS

| | | |
|---|---|---|
| KR | 10-1174884 B1 | 8/2010 |
| KR | 10-2018-0035983 A | 4/2018 |
| KR | 10-2020-0033362 A | 3/2020 |
| KR | 10-2168786 B1 | 10/2020 |
| KR | 10-2021-0066555 A | 6/2021 |

* cited by examiner

*Primary Examiner* — Fernando L Toledo
*Assistant Examiner* — Adam S Bowen
(74) *Attorney, Agent, or Firm* — Innovation Counsel LLP

(57) ABSTRACT

A display apparatus includes a substrate, a display element, an inorganic insulating layer, a first inorganic encapsulation layer, a dam, a first wire, and a power supply line. The substrate includes a display region. The display element is arranged on the display region. The inorganic insulating layer is arranged between the substrate and the display element. The first inorganic encapsulation layer includes a contact region that directly contacts the inorganic insulating layer. The dam surrounds the display region and includes a dam section that is arranged between the display region and the contact region. The first wire crosses the dam and may transmit a first signal toward the display region. The power supply line crosses the dam, overlaps the first wire, and includes protrusions. The protrusions protrude from an edge of the power supply line and overlap the contact region.

27 Claims, 14 Drawing Sheets

DISPLAY APPARATUS

CROSS-REFERENCE TO RELATED APPLICATION

This application claims priority under 35 U.S.C. § 119 to Korean Patent Application No. 10-2022-0023130 filed on Feb. 22, 2022 in the Korean Intellectual Property Office; the Korean Patent Application is incorporated by reference.

BACKGROUND

1. Field

The technical field is related to a display apparatus.

2. Description of the Related Art

A display device may display images in response to input signals. Modern display apparatuses include organic light-emitting display apparatuses.

In general, an organic light-emitting display apparatus may include a thin-film transistor and an organic light-emitting diode. The thin-film transistor may control the organic light-emitting diode to emit light. An organic light-emitting display apparatus may be included in an electronic device, such as a mobile phone or a television. If the organic light-emitting diode is exposed to moisture, the performance of the organic light-emitting diode may be undesirably affected.

SUMMARY

One or more embodiments include a display apparatus with strong resistance against moisture permeation from the outside of a display region thereof. However, the one or more embodiments are only examples, and the scope of the present disclosure is not limited thereto.

Additional aspects will be set forth in part in the description that follows and, in part, will be apparent from the description, or may be learned by practice of the embodiments of the present disclosure.

According to an embodiment, a display apparatus includes a substrate having a display region and a peripheral region in contact with the display region, wherein display elements are arranged in the display region, an inorganic insulating layer arranged in the display region and the peripheral region, a thin-film encapsulation layer disposed over the display element, the thin-film encapsulation layer including a first inorganic encapsulation layer, a second inorganic encapsulation layer, and an organic encapsulation layer between the first inorganic encapsulation layer and the second inorganic encapsulation layer, a dam arranged in the peripheral region to surround the display region, a fan-out wire arranged in the peripheral region and configured to transmit a signal to each of the display elements, and a power supply line arranged in the peripheral region to overlap at least part of the fan-out wire, wherein the first inorganic encapsulation layer and the second inorganic encapsulation layer each include an inorganic contact region which extends outside of the dam and is in contact with the inorganic insulating layer, and protrusion patterns are located at an end of the power supply line overlapping the inorganic contact region.

The power supply line may include a main line extending in a first direction and a connection line extending in a second direction crossing the first direction, and each of the protrusion patterns may extend in a third direction crossing the first direction and the second direction.

Each of the protrusion patterns may include concavo-convex surfaces extending in the third direction.

The concavo-convex surfaces may each have a wave shape with round edges.

The fan-out wire may include a first wire and a second wire alternately arranged with each other, the second wire being disposed over the first wire disposed on a layer different from a layer on which the first wire is disposed, and vertices corresponding to a crest and a valley of each of the concavo-convex surfaces may be disposed on a same wire from among the first wire and the second wire.

The vertices corresponding to the crest and the valley of each of the protrusion patterns may be disposed on the second wire.

Each of the first wire and the second wire may be arranged in the third direction crossing the first direction and the second direction.

The power supply line may be disposed over the inorganic insulating layer, and at least a portion of the power supply line may be in direct contact with the first inorganic encapsulation layer in the inorganic contact region.

The protrusion patterns may be in direct contact with the first inorganic encapsulation layer, which extends outside of the dam.

The first inorganic encapsulation layer extending outside of the dam may be in direct contact with the inorganic insulating layer.

The power supply line may have a triple-layer structure including a first layer, a third layer, and a second layer located between the first layer and the third layer, the first layer and the third layer including a same material as each other.

The first layer and the third layer of the power supply line may each include titanium (Ti), and the second layer may include aluminum (Al).

An end of each of the first layer and the third layer may have a tip that protrudes more than an end of the second layer.

The end of the second layer may be drawn more inward than the tip of each of the first layer and the third layers, and an undercut space may exist between the tip of each of the first layer and the third layer and the end of the second layer.

The first inorganic encapsulation layer may be arranged to cover an area between the tips of the first layer and the third layer.

The first inorganic encapsulation layer may be in direct contact with a side surface of the second layer.

The display apparatus may further include a thin-film transistor including a semiconductor layer, a gate electrode, and an electrode layer, wherein the gate electrode at least partially overlaps the semiconductor layer, and the electrode layer is disposed over the gate electrode and connected to the semiconductor layer, and a connection metal which is disposed over the thin-film transistor and is connected to the electrode layer, and the power supply line may include a same material as the electrode layer or the connection metal.

The fan-out wire may include a first wire and a second wire alternately arranged with each other, the second wire being disposed over the first wire disposed on a layer different from a layer on which the first wire is disposed, the fan-out wire may further include an upper electrode which is located between the gate electrode and the electrode layer and at least partially overlaps the gate electrode, the first wire may include a same material as the gate electrode, and the second line may include a same material as the upper electrode.

In a plan view, the end of the power supply line may include a bent portion extending toward the display region.

The protrusion patterns may be provided at an end of the bent portion.

An embodiment may be related to a display device. The display apparatus may include a substrate, a display element, an inorganic insulating layer, a first inorganic encapsulation layer, a dam, a first wire, and a power supply line. The substrate may include a display region. The display element may be arranged on a face of the display region. The inorganic insulating layer may be arranged between the substrate and the display element. The first inorganic encapsulation layer may include a contact region that directly contacts the inorganic insulating layer. The dam may surround the display region and may include a dam section that is arranged between the display region and the contact region. The first wire may cross the dam and may transmit a first signal toward the display region. The power supply line may cross the dam, may overlap the first wire, and may include protrusions. The protrusions may protrude from an edge of the power supply line and may overlap the contact region.

The power supply line may include a main line extending in a first direction and may include a connection line extending in a second direction different from the first direction. Each of the protrusions may extend in a third direction different from each of the first direction and the second direction.

The protrusions include a protrusion. An edge of the protrusion may include convex structures and concave structures that are alternately arranged in the third direction.

The convex structures each may have a curved edge.

The display apparatus may include a second wire. The second wire may overlap the power supply line, may cross the dam, may transmit a second signal toward the display region, and may be positioned farther from or closer to the substrate than the first wire. Extreme points of the convex structures overlap exactly one of the first wire and the second wire.

The second wire may be positioned farther from the substrate than the first wire. The extreme points of the concave structures may overlap the second wire.

Each of the first wire and the second wire may extend in the third direction.

The power supply line may be disposed on the inorganic insulating layer and may directly contact the contact region.

The protrusions may direct contact the contact region.

The dam section may be positioned between a main line of the power supply line and the protrusions.

The power supply line may include a first layer, a third layer, and a second layer located between the first layer and the third layer. The first layer and the third layer may include a same material.

The first layer and the third layer each comprise titanium (Ti). The second layer may include aluminum (Al).

Each of an edge portion of the first layer and an edge portion of the third layer may protrude beyond a surface of the second layer in a direction parallel to the substrate (i.e., a direction parallel to the face of the display region).

A recess exists between the edge portion of the first layer and edge portion of the third layer, between the edge portion of the first layer and the surface of the second layer, and between the edge portion of the third layer and the surface of the second layer.

The first inorganic encapsulation layer may fill the recess.

The first inorganic encapsulation layer may directly contact the surface of the second layer.

The display apparatus may include the following elements: a thin-film transistor including a semiconductor layer, a gate electrode, and an electrode layer, wherein the gate electrode may overlap the semiconductor layer, and wherein the electrode layer may be electrically connected to the semiconductor layer; and a connection metal disposed over the thin-film transistor and electrically connected to the electrode layer. The power supply line may include a same material as at least one of the electrode layer and the connection metal.

The display apparatus may include the following elements: a second wire overlapping the power supply line, crossing the dam, configured to transmit a second signal toward the display region, and positioned farther from or closer to the substrate than the first wire; and a capacitor electrode overlapping the gate electrode. A material of the first wire may be identical to a material of the gate electrode. A material of the second line may be identical to a material of the capacitor electrode.

The power supply line may include a bent structure overlapping the contact region and bent toward the display region.

The protrusions may protrude from an edge of the bent portion.

An embodiment may be related to a display device. The display device may include the following elements: a substrate having a display region; a display element arranged on the display region; an inorganic insulating layer arranged between the substrate and the display element; a first inorganic encapsulation layer including a contact region that directly contacts the inorganic insulating layer; a first wire configured to transmit a first signal toward the display region; and a power supply line overlapping a section of the first wire and may include protrusions. The protrusions may protrude from an edge of the power supply line, may extend oblique relative to the edge of the power supply line, extend parallel to the section of the first wire, and may overlap the contact region.

The display apparatus a dam surrounding the display region and including a section positioned between the display region and the contact region.

The protrusions may include a protrusion. The protrusion may include convex structures and concave structures that are alternately arranged in a direction parallel to the section of the first wire.

Vertices of the convex structures may overlap the section of the first wire.

The display apparatus may include a second wire spaced from the first wire and configured to transmit a second signal toward the display region. Vertices of the concave structures may overlap the second wire.

The power supply line may include a first layer, a third layer, and a second layer located between the first layer and the third layer. The first layer and the third layer may include a same material.

Each of an edge portion of the first layer and an edge portion of the third layer may protrude beyond an edge of the second layer in a direction parallel to the substrate.

DETAILED DESCRIPTION

Figure 1:
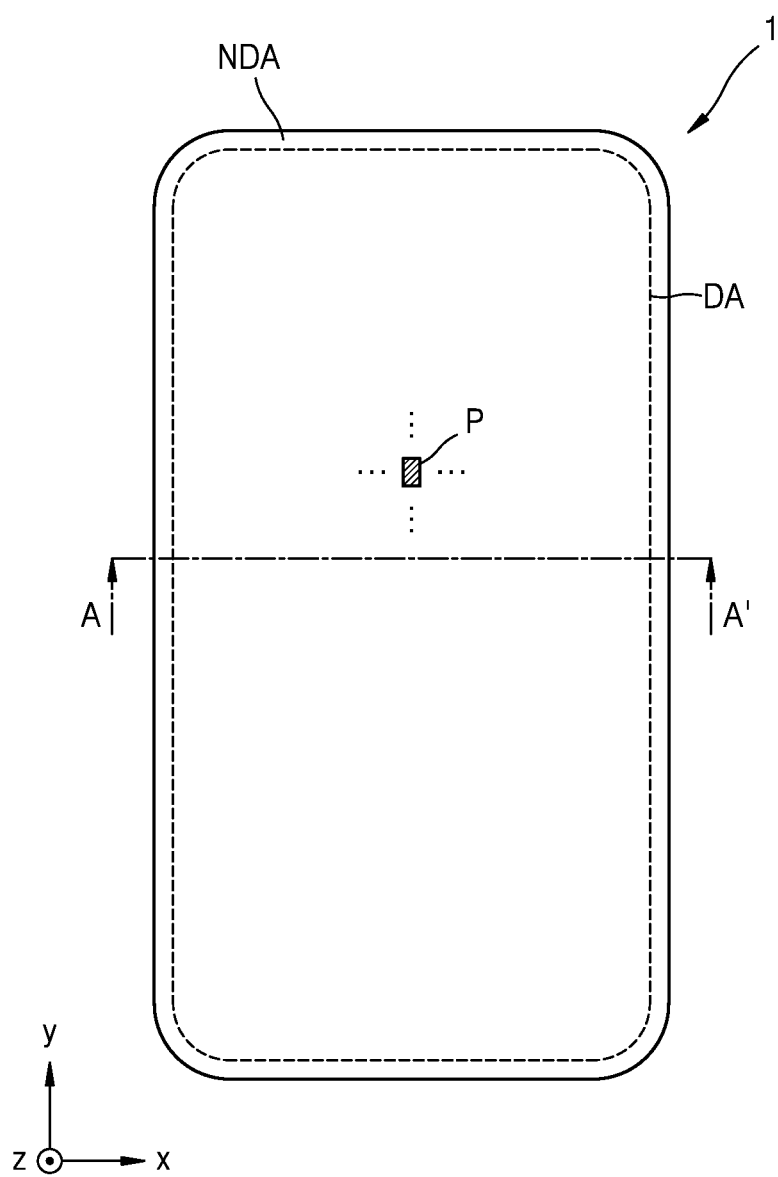
FIG. 1 is a plan view schematically illustrating a portion of a display apparatus according to an embodiment.

Examples of embodiments are described with reference to the accompanying drawings, wherein like reference numerals may refer to like elements. Practical embodiments may have different forms and should not be construed as being limited to the described embodiments.

Although the terms "first," "second," etc. may be used to describe various elements, these elements should not be limited by these terms. These elements may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

The singular forms "a," "an," and "the" may indicate the plural forms as well, unless the context clearly indicates otherwise.

Terms such as "comprise," "include," and "have" may specify the presence of stated features or elements, but may not preclude the presence or addition of one or more other features or elements.

The term "on" may mean "directly on" or "indirectly on." The term "connect" may mean "directly connect" or "indirectly connect." The term "connect" may mean "mechanically connect" and/or "electrically connect." The term "connected" may mean "electrically connected" or "electrically connected through no intervening transistor." The term "insulate" may mean "electrically insulate" or "electrically isolate." The term "conductive" may mean "electrically conductive." The term "drive" may mean "operate" or "control." The term "include" or "comprise" may mean "be made of." The term "adjacent" may mean "immediately adjacent." The term "contact" may mean "directly contact." The expression that an element extends in a particular direction may mean that the element extends lengthwise in the particular direction and/or that the lengthwise direction of the element is in the particular direction. The noun "pattern" may mean "structure" or "member." The term "defined" may mean "formed" or "provided." The expression that a space or opening overlaps an object may mean that (the position of) the space or opening overlaps with (the position of) the object. The term "overlap" may be equivalent to "be overlapped by." The expression that a first element overlaps with a second element in a plan view may mean that the first element overlaps the second element in direction perpendicular to a substrate. The term "fan-out wire" may mean "transmission wire," "conductive wire," and/or "connection wire." The term "have" may mean include. The term "tip" may mean "edge" or "edge portion." The term "end" may mean "edge." The term "undercut" may mean "recess."

The x-axis, the y-axis, and the z-axis may or may not be perpendicular to one another.

When an embodiment may be implemented differently, a certain process order may be performed differently from the described order. For example, two consecutively described processes may be performed substantially at the same time or performed in an order opposite to the described order.

Dimensions of elements in the drawings may be exaggerated or reduced for clarity and/or convenience of explanation.

FIG. 1 is a plan view schematically illustrating a portion of a display apparatus 1 according to an embodiment.

Referring to FIG. 1, the display apparatus 1 may include a display region DA and a peripheral region NDA outside the display region DA. Pixels P each including a display element may be arranged in the display region DA. The display apparatus 1 may provide an image using light emitted from the pixels P. The peripheral region NDA is a non-display region including no display elements and may surround the display region DA.

In FIG. 1, the display apparatus 1 has a flat display surface. The display apparatus 1 may include a three-dimensional display surface or a curved display surface.

When the display apparatus 1 includes the three-dimensional display surface, the display apparatus 1 may include display regions facing different directions and may include, for example, a polygonal columnar display surface. The display apparatus 1 may be flexible, foldable, and/or rollable.

The display apparatus 1 may be applicable to a mobile phone terminal. Electronic modules, camera modules, power modules, etc. mounted on a main board may be arranged in a bracket or case together with the display apparatus 1, so as to form a mobile phone terminal. The display apparatus 1 may be applicable to a television, a monitor, an automobile navigation device, a game console, and/or a smart watch.

The display region DA of the display apparatus 1 may have a rectangular shape with round edges. The display region DA may have a circular shape, an elliptical shape, and/or a polygonal shape, such as a triangle or a pentagon.

The display region DA of the display apparatus 1 may include a component region in which an arrangement of pixels P is different from an arrangement of pixels P in a periphery of the component region. The display apparatus 1 may include a display panel DP (see FIG. 4). At one side of the display panel DP, a sensor, a camera, etc., for example, may be arranged to overlap the component region. The component region may be arranged in the peripheral region NDA.

An organic light-emitting display apparatus is described as an example of the display apparatus 1. The display apparatus 1 may include/be an inorganic light-emitting display apparatus (inorganic light-emitting display or an inorganic electroluminescent (EL) display apparatus) and/or a quantum dot light-emitting display. An emission layer of a display element included in the display apparatus 1 may include an organic material, an inorganic material, quantum dots, an organic material and quantum dots, or an inorganic material and quantum dots.

Figure 2A:
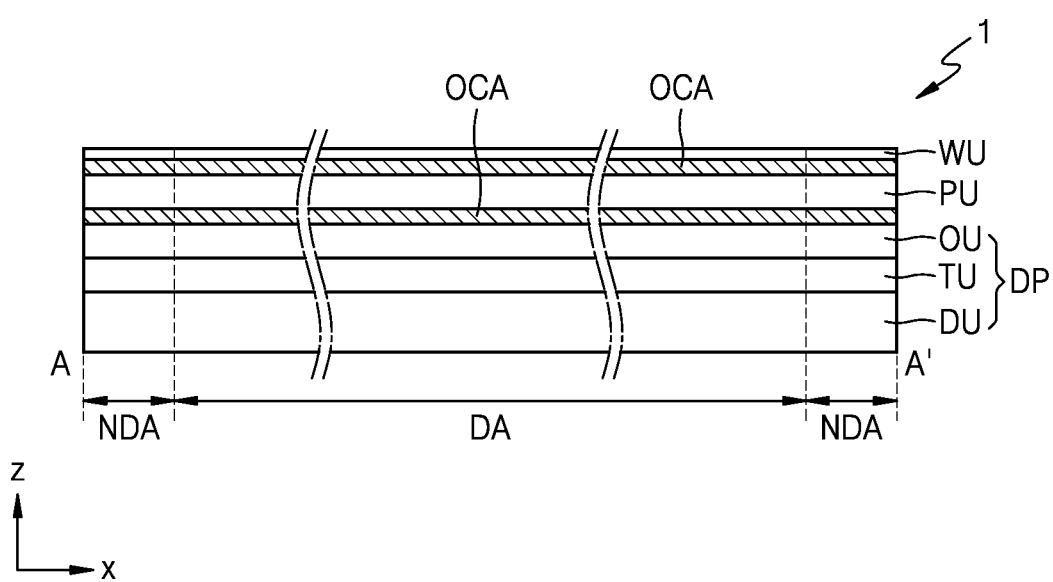
FIG. 2A is a cross-sectional view schematically illustrating a cross-section of a display apparatus taken along line A-A' in FIG. 1 according to an embodiment.
Figure 2B:
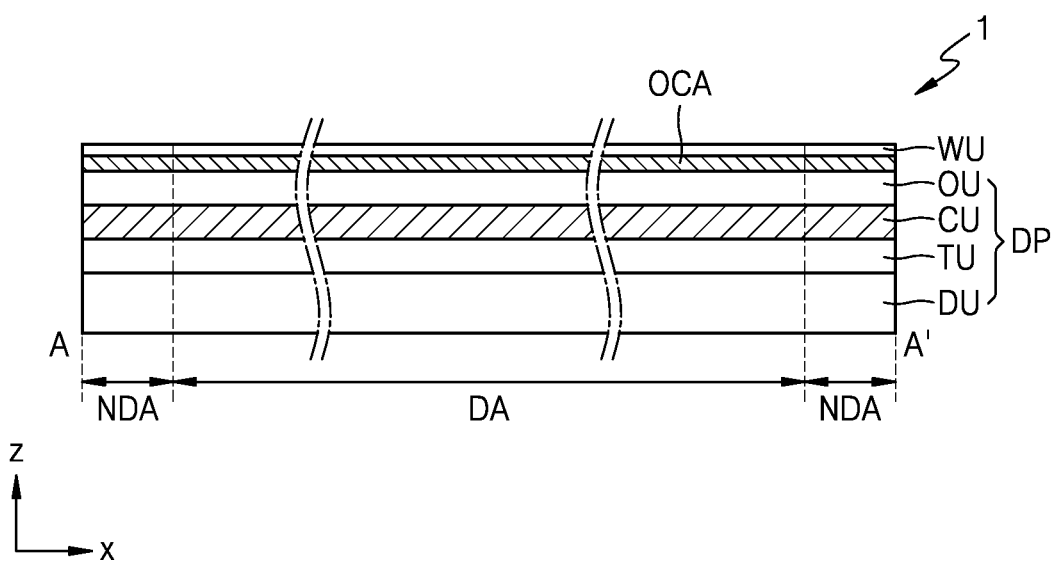
FIG. 2B is a cross-sectional view schematically illustrating a cross-section of a display apparatus taken along line A-A' in FIG. 1 according to an embodiment.

Each of FIGS. 2A and 2B is a cross-sectional view schematically illustrating a cross-section of the display apparatus 1 taken along line A-A' in FIG. 1 according to an embodiment.

FIGS. 2A and 2B each illustrate a functional panel and functional layers that are included in the display apparatus 1.

Referring to FIG. 2A, the display apparatus 1 may include a display layer DU, an input sensing layer TU, an optical functional layer OU, an anti-reflection layer PU, and a window layer WU. At least some elements from among the display layer DU, the input sensing layer TU, the optical functional layer OU, the anti-reflection layer PU, and the window layer WU may be formed in a continuous process, or may be coupled to each other by an adhesive member. In FIG. 2A, an optically clear adhesive (OCA) member is shown as the adhesive member. The adhesive member may include a common adhesive or pressure-sensitive adhesive. The anti-reflection layer PU and the window layer WU may be replaced with other elements or may be optional.

The input sensing layer TU may be directly disposed on the display layer DU. The expression "feature B is directly disposed on feature A" may mean that no adhesive layer or adhesive member is disposed between feature A and feature B. After feature A is provided, feature B may be provided/formed on feature A (in a continuous process).

The display layer DU, the input sensing layer TU, and the optical functional layer OU may be included in the display panel DP and may form the display panel DP. An OCA may be located between the display panel DP and the anti-reflection layer PU. An OCA may be located between the anti-reflection layer PU and the window layer WU.

The display panel DP may include an anti-reflection layer CU, as shown in FIG. 2B. The anti-reflection layer CU may be between the input sensing layer TU and the optical functional layer OU. The anti-reflection layer CU may include a color filter corresponding to an emission region of each of the pixels P and a light-shielding layer corresponding to a non-emission region between the pixels P. The anti-reflection layer CU may be directly disposed on the display panel DP.

The display layer DU may emit light to generate an image. The input sensing layer TU may obtain coordinate information of an external input (e.g., a touch event). Although not shown, the display panel DP may further include a protective member on a lower surface of the display layer DU. The protective member and the display layer DU may be bonded to each other by an adhesive member.

The optical functional layer OU may improve light efficiency. For example, the optical functional layer OU may improve the front light efficiency and/or side visibility of light emitted by an organic light-emitting diode.

The anti-reflection layer PU may reduce reflectivity of external light incident from an upper side of the window layer WU. The anti-reflection layer PU may include a retarder and a polarizer. The retarder may include a film-type retarder or a liquid crystal coating-type retarder, and may include a $\Delta/2$ retarder and/or a $\Delta/4$ retarder. The polarizer may also include a film-type polarizer and/or a liquid crystal coating-type polarizer. The film-type polarizer may include a stretchable synthetic resin film. The liquid crystal coating-type polarizer may include liquid crystals arranged in a certain arrangement. Each of the retarder and the polarizer may further include a protective film. The retarder and the polarizer themselves or the protective film may be a base layer of the anti-reflection layer PU.

Figure 3:
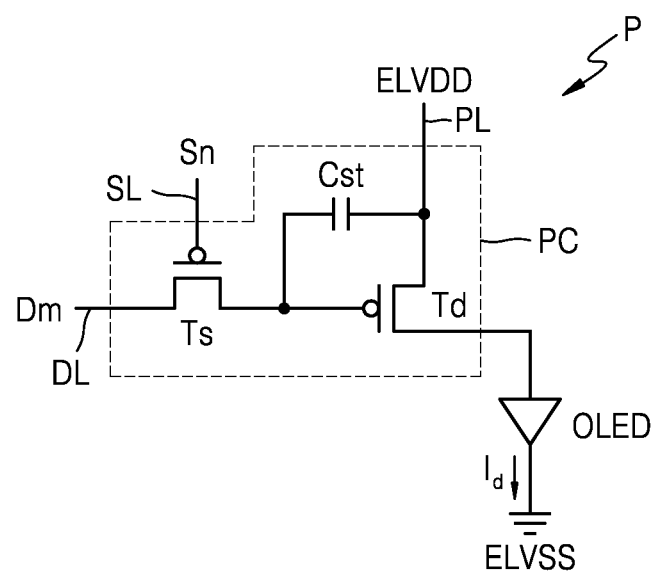
FIG. 3 is an equivalent circuit diagram of a pixel included in a display apparatus according to an embodiment.

FIG. 3 is an equivalent circuit diagram of a pixel P included in the display apparatus 1 according to an embodiment.

Referring to FIG. 3, the pixel P may include a pixel circuit PC and an organic light-emitting diode OLED electrically connected to the pixel circuit PC. The pixel circuit PC may be connected to a scan line SL and a data line DL.

The pixel circuit PC may include a driving thin-film transistor Td, a switching thin-film transistor Ts, and a storage capacitor Cst. The switching thin-film transistor Ts may be connected to the scan line SL and the data line DL and may transmit, to the driving thin-film transistor Td, a data signal Dm received via the data line DL in response to a scan signal Sn received via the scan line SL.

The storage capacitor Cst may be connected to the switching thin-film transistor Ts and a driving voltage line PL and may store a voltage corresponding to a voltage difference between a voltage received from the switching thin-film transistor Ts and a driving voltage ELVDD applied to the driving voltage line PL.

The driving thin-film transistor Td may be connected to the driving voltage line PL and the storage capacitor Cst and may control a driving current flowing in the organic light-emitting diode OLED from the driving voltage line PL to correspond to the voltage stored in the storage capacitor Cst. The organic light-emitting diode OLED may emit light having a brightness according to a driving current $I_d$.

In FIG. 3, the pixel circuit PC includes two thin-film transistors and one storage capacitor. The pixel circuit PC may include seven thin-film transistors and one storage capacitor. The pixel circuit PC may include two or more storage capacitors.

Figure 4:
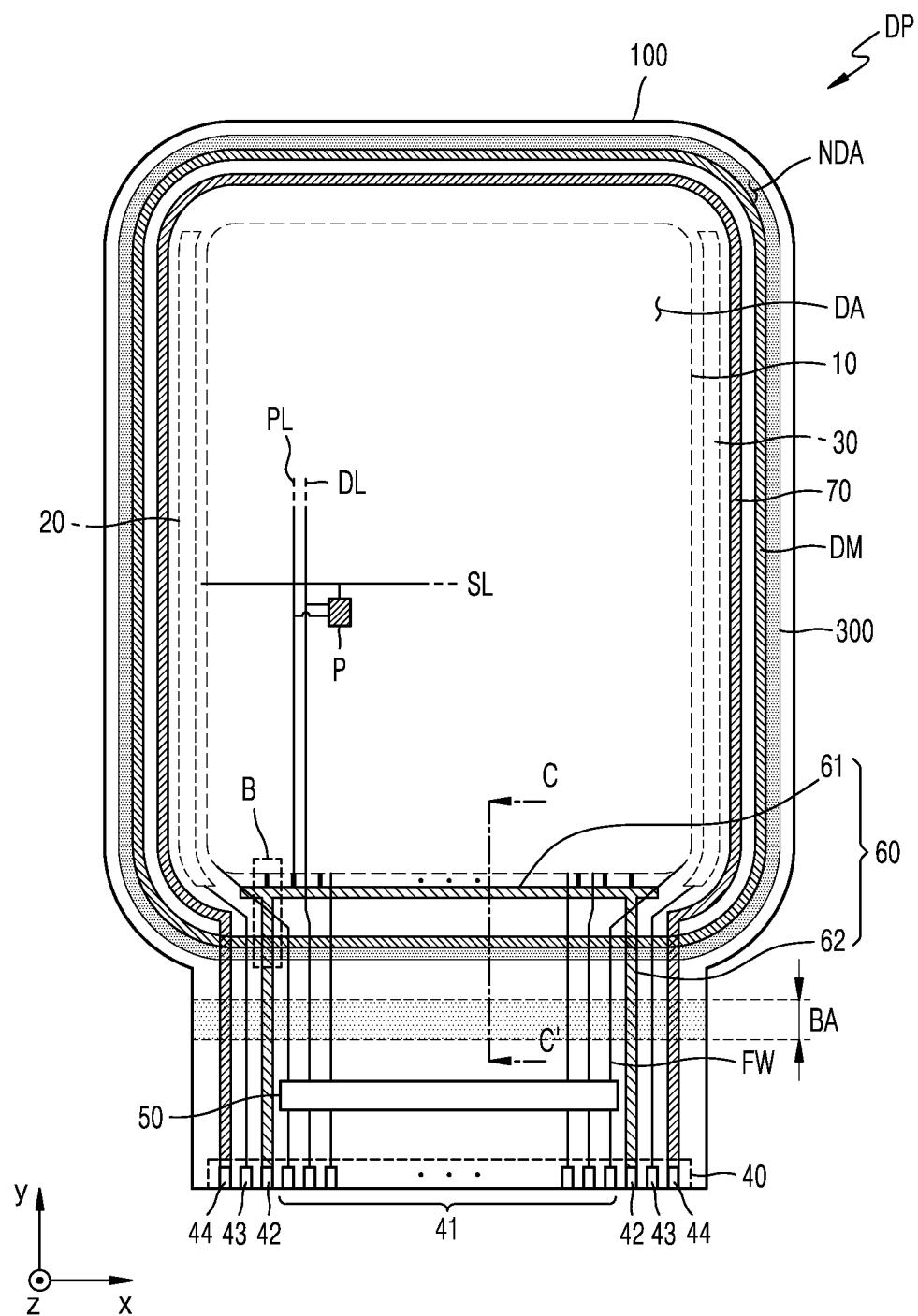
FIG. 4 is a plan view schematically illustrating a display panel included in the display apparatus in FIG. 1 according to an embodiment.
Figure 5:
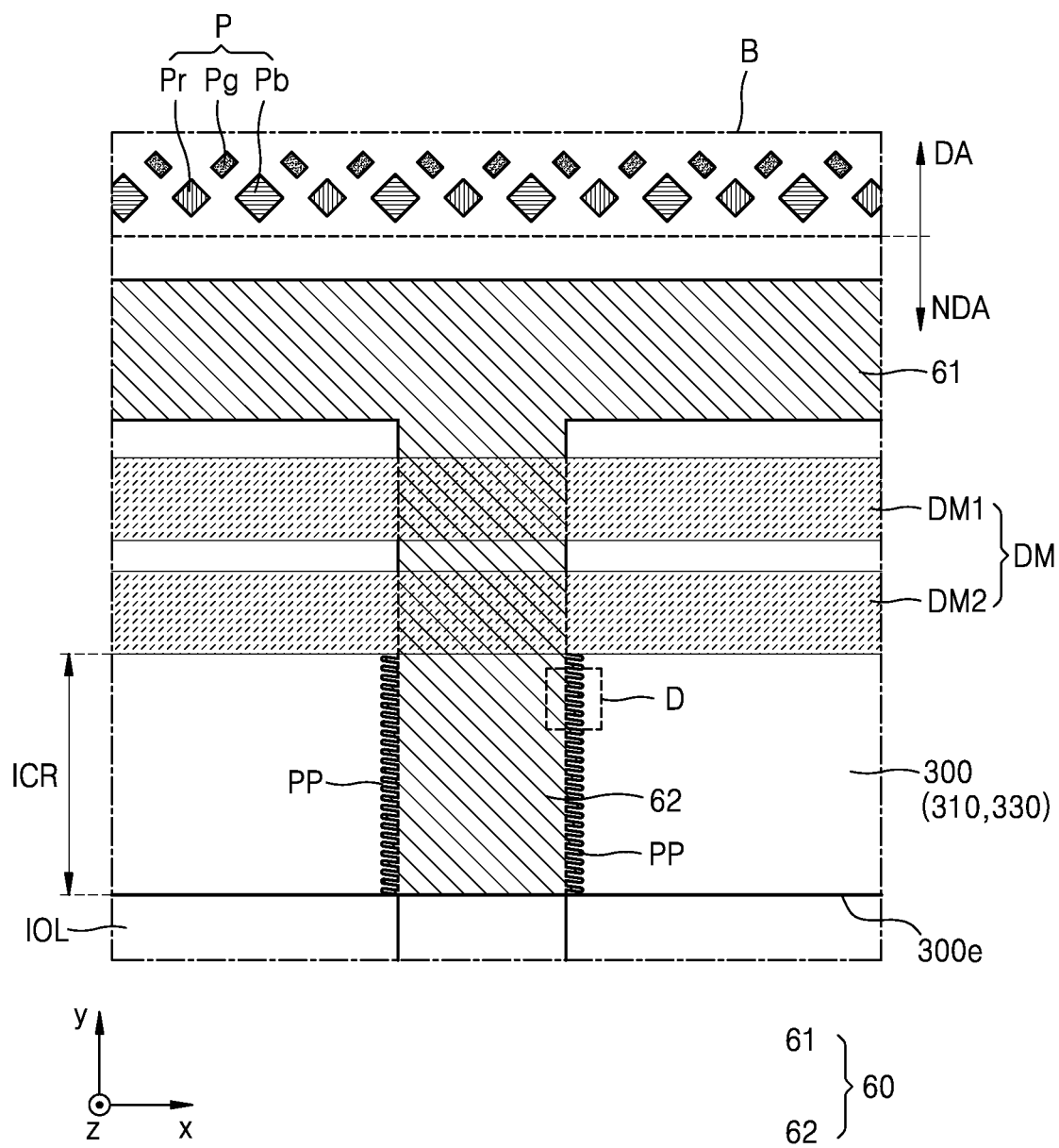
FIG. 5 is a plan view illustrating region B in FIG. 4 according to an embodiment.

FIG. 4 is a plan view schematically illustrating the display panel DP included in the display apparatus 1 in FIG. 1 according to an embodiment. FIG. 5 is a plan view of region B in FIG. 4 according to an embodiment.

Referring to FIG. 4, the display panel DP may include a display unit 10, first and second scan driving units 20 and 30, a terminal unit 40, a data driving unit 50, a driving voltage supply line 60, and a common voltage supply line 70, which are disposed on a substrate 100. An emission control driving unit (not shown) may be further arranged at one side of the first scan driving unit 20.

The substrate 100 may include a glass material, metal, and/or an organic material. The substrate 100 may include a flexible material. For example, the substrate 100 may include a polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate.

The substrate 100 may have a multi-layer structure including two layers and a barrier layer between the two layers, wherein the two layers may include the polymer resin, and the barrier layer may include an inorganic material (e.g., silicon oxide, silicon nitride, silicon oxynitride, etc.).

The substrate 100 may include a display region DA and a peripheral region NDA surrounding the display region DA. An extension of the peripheral region NDA may extend further beyond the display region DA in a-y direction. The terminal unit 40, the data driving unit 50, the driving voltage supply line 60, and a fan-out wire FW may be arranged on the extension of the peripheral region NDA. A width of the extension of the peripheral region NDA in an x-axis direction may be less than a width of the display region DA in the x-axis direction.

The substrate 100 may include a bending region BA, which may be a portion of the extension of the peripheral region NDA and may be bent. When the extension of the peripheral region NDA is folded at the bending region BA, the extension of the peripheral region NDA may overlap a portion of the display region DA. Through this structure, the extension of the peripheral region NDA may be hidden behind the display region DA, and a length of the peripheral region NDA may be reduced.

The display unit 10 may include pixels P arranged in the display region DA. A pixel P may be connected to a scan line SL extending in a first direction (e.g., an x direction) and may be connected a data line DL and a driving voltage line PL each extending in a second direction (e.g., a y direction) and crossing the scan line SL. Each of the pixels P may emit red, green, blue, or white light and include an organic light-emitting diode. Referring to FIG. 5, the pixel P may include a red sub-pixel Pr, a green sub-pixel Pg, and a blue sub-pixel Pb.

The display unit 10 may display an image using light emitted from the pixels P, and the display region DA may be defined by the pixels P. The display unit 10 may have a substantially quadrangular shape, a polygonal shape, a circular shape, and/or an elliptical shape. The display unit 10 may have rounded corners. The substrate 100 may have curved edge portions.

The first scan driving unit 20 and the second scan driving unit 30 may be arranged on the peripheral region NDA of the substrate 100, may generate scan signals, and provide the scan signals to the pixels P via the scan lines SL. The first scan driving unit 20 may be arranged on a left side of the display unit 10, and the second scan driving unit 30 may be arranged on a right side of the display unit 10. The first and second scan driving units 20 and 30 may be at opposite sides or a same side of the display unit 10.

The terminal unit 40 may be arranged at one end of the substrate 100 and may include terminals 41, 42, 43, and 44. The terminal unit 40 may be exposed by an insulating layer and may be electrically connected to a controller on a flexible printed circuit board and/or in an integrated circuit (IC) chip.

The data driving unit 50 may be arranged in/on the peripheral region NDA of the substrate 100, may generate data signals, and may provide the data signals to the pixels P via the data lines DL. The data driving unit 50 may be arranged at one side of the display unit 10 and may be positioned between the terminal unit 40 and the display unit 10. In FIG. 4, the data driving unit 50 is disposed on the substrate 100. The data driving unit 50 may be provided on a flexible printed circuit board connected to the terminal unit 40.

The controller (not shown) may change image signals received from the outside into image data signals and may provide the image data signals to the data driving unit 50 via the terminals 41. Using the image data signals, the data driving unit 50 may generate data signals and may provide the data signals to the display region DA via the fan-out wires FW (or transmission wires FW). The controller may receive a vertical synchronization signal, a horizontal synchronization signal, and a clock signal and may generate control signals for controlling the first and second scan driving units 20 and 30 and may provide the control signals to the first and second scan driving units 20 and 30 via the terminals 43. The controller may provide the driving voltage ELVDD and a common voltage ELVSS to the driving voltage supply line 60 and the common voltage supply line 70, respectively.

The driving voltage supply line 60 may be arranged in/on the peripheral region NDA. The driving voltage supply line 60 may be substantially located between the data driving unit 50 and the display unit 10. The driving voltage supply line 60 may apply the driving voltage ELVDD to the pixels P. The driving voltage supply line 60 may include a main line 61 extending in the first direction (e.g., the x direction) and a connection line 62 extending in the second direction (e.g., the −y or y direction) from the main line 61. The driving voltage supply line 60 may have a "π" (pi) shape. The driving voltage supply line 60 may be connected to driving voltage lines PL arranged in the second direction (e.g., the y direction).

The driving voltage supply line 60 may overlap a fan-out wire FW. A portion of the fan-out wire FW may extend in a third direction different from each of the first direction (e.g., the x direction) and the second direction (e.g., the y direction).

The common voltage supply line 70 is arranged in/on the peripheral region NDA and may apply the common voltage ELVSS to an opposite electrode 230 (see FIG. 6) of an organic light-emitting diode OLED (see FIG. 6) of each pixel P. The common voltage supply line 70 may have a loop shape of which one side is open, and may extend along edges of the substrate 100 excluding an edge corresponding to the terminal unit 40.

Referring to FIGS. 4 and 5, a dam DM may be arranged in the peripheral region NDA. The dam DM may surround a periphery of the display unit 10. The dam DM may include a first dam DM1 and a second dam DM2. The first dam DM1 may surround the display unit 10, and the second dam DM2 may surround the first dam DM1. The first dam DM1 and the second dam DM2 may be spaced from each other.

The dam DM may be arranged outside the common voltage supply line 70, and/or may at least partially overlap the common voltage supply line 70.

A thin-film encapsulation layer 300 may be arranged in/on the display region DA to cover the pixels P, and a portion of the thin-film encapsulation layer 300 may extend to the peripheral region NDA. The thin-film encapsulation layer 300 may have a multi-layer structure including at least one organic encapsulation layer and at least one inorganic encapsulation layer. The dam DM may prevent an organic encapsulation layer 320 (see FIG. 6) included in the thin-film encapsulation layer 300 from overflowing.

Figure 6:
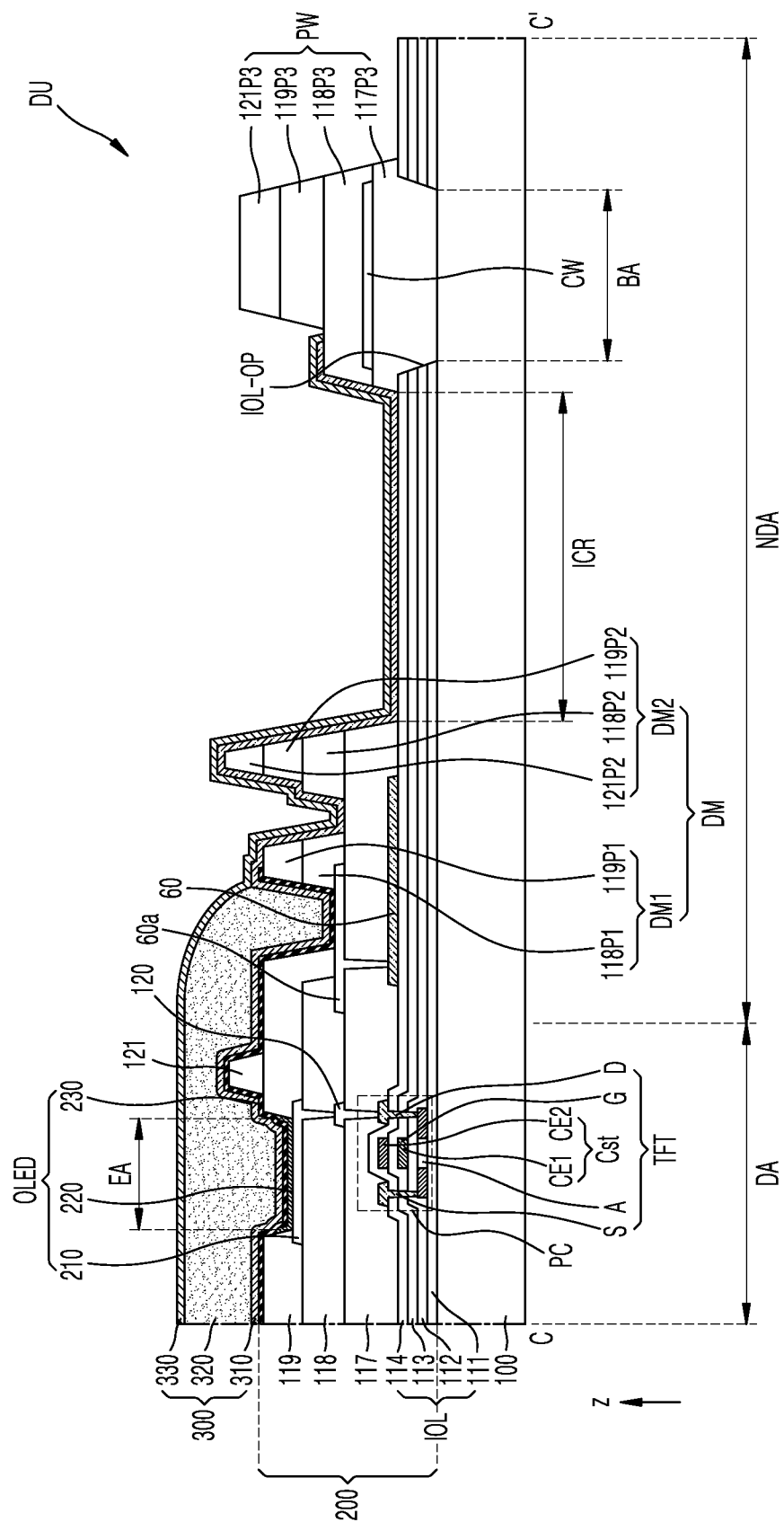
FIG. 6 is a cross-sectional view schematically illustrating a cross-section of a display apparatus taken along line C-C' in FIG. 4 according to an embodiment.

Referring to FIG. 5 and FIG. 6, the thin-film encapsulation layer 300 may further include a first inorganic encapsulation layer 310 and a second inorganic encapsulation layer 330. The first and second inorganic encapsulation layers 310 and 330 may extend toward an edge of the substrate 100 beyond the dam DM, and an inorganic contact region ICR where the first inorganic encapsulation layer 310 and a lower inorganic layer IOL contact with each other may be provided outside the dam DM.

At least a portion of the inorganic contact region ICR may overlap a portion of the connection line 62 of the driving voltage supply line 60. The connection line 62 may be between the lower inorganic layer IOL and the first inorganic encapsulation layer 310 in the inorganic contact region ICR. Because the connection line 62 extends in the second direction (e.g., the y direction), moisture may permeate the dam DM along edges of the connection line 62 if the edges are substantially smooth.

To prevent moisture from substantially permeating the dam DM, the driving voltage supply line 60 may include protrusions PP overlapping with the inorganic contact region ICR. The protrusions PP may be provided at edges of the driving voltage supply line 60 and may substantially protrude in the x direction and the −x direction. The protrusions PP elongate a path for moisture permeation (e.g., a path in the +y direction toward the display region DA).

FIG. 6 is a cross-sectional view schematically illustrating a cross-section of the display apparatus taken along line C-C' in FIG. 4 according to an embodiment.

A buffer layer 111 may be disposed on the substrate 100. The buffer layer 111 may prevent impurities from entering elements disposed on the substrate 100 via the substrate 100.

A pixel circuit PC including a thin-film transistor TFT and the storage capacitor Cst may be disposed on the buffer layer 111. The thin-film transistor TFT may include a semiconductor layer A, a gate electrode G, a source electrode S, and a drain electrode D, wherein the gate electrode G overlaps a channel region of the semiconductor layer A, and wherein the source electrode S and the drain electrode D are respectively connected to a source region and a drain region of the semiconductor layer A. A gate insulating layer 112 may be between the semiconductor layer A and the gate electrode G. A first interlayer insulating layer 113 and a second interlayer insulating layer 114 may be between the gate electrode G and the source electrode S and between the gate electrode G and the drain electrode D.

The storage capacitor Cst may overlap the thin-film transistor TFT. The storage capacitor Cst may include a first capacitor plate CE1 and a second capacitor plate CE2, which overlap each other. The gate electrode G of the thin-film transistor TFT may be integrally provided as a single body with the first capacitor plate CE1 of the storage capacitor Cst. The first interlayer insulating layer 113 may be located between the first capacitor plate CE1 and the second capacitor plate CE2.

The semiconductor layer A may include a channel region, a source region, and a drain region, the source region and the drain region being doped with impurities. The semiconductor layer A may include a silicon semiconductor material. The semiconductor layer A may include polysilicon or amorphous silicon. The semiconductor layer A may include an oxide semiconductor material. The pixel circuit PC may include thin-film transistors TFT, wherein some of the thin-film transistors TFT may include a silicon semiconductor material, and wherein the other ones may include an oxide semiconductor material. When the semiconductor layer A includes the oxide semiconductor material, the semiconductor layer A may include, for example, an oxide of at least one of indium (In), gallium (Ga), stannum (Sn), zirconium (Zr), hafnium (Hf), titanium (Ti), and zinc (Zn).

The gate insulating layer 112 may include an inorganic insulating material, such as silicon oxide, silicon oxynitride, and silicon nitride, and may be/have a layer or layers.

The gate electrode G or the first capacitor plate CE1 may include a low-resistance conductive material, such as molybdenum (Mo), aluminum (Al), copper (Cu), and/or Ti, and may be/have a layer or layers.

The first interlayer insulating layer 113 may include an inorganic insulating material, such as silicon oxide, silicon oxynitride, and silicon nitride, and may be/have a layer or layers.

The second capacitor plate CE2 may include Al, chromium (Cr), Mo, Ti, tungsten (W), and/or Cu, and may be/have a layer or layers.

The second interlayer insulating layer 114 may include an inorganic insulating material, such as silicon oxide, silicon oxynitride, and silicon nitride, and may be/have a layer or layers.

The source electrode S or the drain electrode D may include Al, Mo, Ti, W, and/or Cu, and may be/have a layer or layers. The source electrode S or the drain electrode D may have a three-layer structure of a Ti layer, an Al layer, and another Ti layer.

A first planarization insulating layer 117 may include a material different from a material of at least one underlying inorganic insulating layer IOL, e.g., the buffer layer 111, the gate insulating layer 112, the first interlayer insulating layer 113, and the second interlayer insulating layer 114. The first planarization insulating layer 117 may include an organic insulating material, such as acryl, benzocyclobutene (BCB), polyimide, or hexamethyldisiloxane (HMDSO).

A second planarization insulating layer 118 may be disposed on the first planarization insulating layer 117. The second planarization insulating layer 118 may include an organic insulating material, such as acryl, BCB, polyimide, or HMDSO. A contact metal 120 may be disposed on the first planarization insulating layer 117. The thin-film transistor TFT and a pixel electrode 210 may be electrically connected to each other via the contact metal 120.

The pixel electrode 210 may be disposed on the second planarization insulating layer 118. The pixel electrode 210 may include a reflective layer including silver (Ag), magnesium (Mg), Al, platinum (Pt), palladium (Pd), gold (Au), nickel (Ni), neodymium (Nd), iridium (Ir), Cr, or a compound/alloy of some of the metals. The pixel electrode 210 may include a reflective layer and a transparent conductive layer disposed on and/or under the reflective layer. The transparent conductive layer may include indium tin oxide (ITO), indium zinc oxide (IZO), zinc oxide (ZnO), indium oxide ($In_2O_3$), indium gallium oxide (IGO), or aluminum zinc oxide (AZO). The pixel electrode 210 may have a three-layer structure of an ITO layer, an Ag layer, and another ITO layer that are sequentially stacked.

A pixel-defining layer 119 may cover an edge of the pixel electrode 210 and may include an opening that exposes a center of the pixel electrode 210. The pixel-defining layer 119 may include an organic insulating material, such as BCB, polyimide, or HMDSO. An emission region EA may be defined by the opening, and red, green, or blue light may be emitted through the emission region EA. An area or width of the emission region EA may be an area or width of a pixel.

A spacer 121 may be provided on the pixel-defining layer 119. The spacer 121 may prevent layers under the spacer 121 from being damaged by a mask in a process of forming an intermediate layer 220. The spacer 121 may include the same material as the pixel-defining layer 119, or may include a material different from a material of the pixel-defining layer 119. When the spacer 121 includes the same material as the pixel-defining layer 119, the spacer 121 and the pixel-defining layer 119 may be integrally provided as a single body through a half-tone mask.

The intermediate layer 220 may include an emission layer overlapping the pixel electrode 210. The emission layer may include an organic material. The emission layer may include a polymer organic material or low-molecular weight organic material emitting light of a predetermined color. The emission layer may be provided through a deposition process using a mask.

A first functional layer and a second functional layer may be disposed under and on the emission layer, respectively. Although emission layers may be patterned and separated for pixels, each of the first functional layer and the second functional layer may be shared by multiple pixels and may overlap an entire face of the display region DA.

The first functional layer may be/have a layer or layers. When the first functional layer includes a polymer material, the first functional layer may be a hole transport layer (HTL) including poly(3,4-ethylenedioxythiophene) (PEDOT) or polyaniline (PANI). When the first functional layer includes a low-molecular weight material, the first functional layer may include a hole injection layer (HIL) and an HTL.

The second functional layer may be optional. When the first functional layer and the emission layer include a polymer material, the second functional layer may be provided. The second functional layer may be/have a layer or layers. The second functional layer may include an electron transport layer (ETL) and/or an electron injection layer (EIL).

The opposite electrode 230 may include a conductive material having a relatively low work function. The opposite electrode 230 may include a (semi-)transparent layer including Ag, Mg, Al, Ni, Cr, Li, Ca, or an alloy of some of the metals. The opposite electrode 230 may further include an ITO layer, an IZO layer, a ZnO layer, or an $In_2O_3$ layer on the (semi-)transparent layer. The opposite electrode 230 may include Ag and Mg.

The pixel electrode 210, the intermediate layer 220, and the opposite electrode 230 are sequentially stacked in a light-emitting diode, for example, the organic light-emitting diode OLED. A display layer including the pixel circuit PC, the insulating layers, and the organic light-emitting diode OLED may be covered with the thin-film encapsulation layer 300.

The thin-film encapsulation layer 300 may include the first and second inorganic encapsulation layers 310 and 330 and may include the organic encapsulation layer 320 between the layers 310 and 330.

Each of the first and second inorganic encapsulation layers 310 and 330 may include one or more inorganic insulating materials. The inorganic insulating materials may include aluminum oxide, titanium oxide, tantalum oxide, hafnium oxide, zinc oxide, silicon oxide, silicon nitride, and/or silicon oxynitride. The first and second inorganic encapsulation layers 310 and 330 may be provided through a chemical vapor deposition (CVD) process.

The organic encapsulation layer 320 may include a polymer-based material. The polymer-based material may include an acryl-based resin, an epoxy-based resin, polyimide, and/or polyethylene. The organic encapsulation layer 320 may include an acryl-based resin, such as poly(methyl methacrylate) and/or polyacrylic acid. The organic encapsulation layer 320 may be provided by curing a monomer or applying a polymer.

The thin-film encapsulation layer 300 may cover a face of the entire display region DA, and may partially cover the peripheral region NDA. The thin-film encapsulation layer 300 may extend beyond the driving voltage supply line 60.

The input sensing layer TU and the optical functional layer OU described with reference to FIG. 2A, etc. may be disposed on the thin-film encapsulation layer 300.

The dam DM may be arranged in the peripheral region NDA adjacent to the display region DA. The dam DM may surround the display region DA, as described with reference to FIG. 4.

Referring to FIG. 6, the dam DM may include the first dam DM1 and the second dam DM2. The dam DM may include only the first dam DM1 or may further include a partition wall adjacent to the second dam DM2. The first dam DM1 and the second dam DM2 may surround the display region DA. The first dam DM1 and the second dam DM2 may be spaced from each other. Valley structures may be provided between the first dam DM1 and the display region DA and between the first dam DM1 and the second dam DM2. The first dam DM1, the second dam DM2, and the valley structure may prevent the organic encapsulation layer 320 of the thin-film encapsulation layer 300 from overflowing toward an edge of the substrate 100.

The organic encapsulation layer 320 may indirectly contact an inner side surface of the first dam DM1 facing the display region DA through the first inorganic encapsulation layer 310, which is located between the organic encapsulation layer 320 and the first dam DM1. The organic encapsulation layer 320 may directly contact the first inorganic encapsulation layer 310. The first inorganic encapsulation layer 310 and the second inorganic encapsulation layer 330 may be disposed on the first dam DM1 and the second dam DM2 and each may extend toward the edge of the substrate 100.

The first dam DM1 and the second dam DM2 may be disposed on the first planarization insulating layer 117. The first planarization insulating layer 117 may extend to the peripheral region NDA, and the first dam DM1 and the second dam DM2 may be disposed on the portion of the first planarization insulating layer 117 extending to the peripheral region NDA. The first planarization insulating layer 117 may be patterned and included in the first dam DM1 and the second dam DM2.

The first dam DM1 may include a portion 118P1 of the second planarization insulating layer 118 and a portion 119P1 of the pixel-defining layer 119. The second dam DM2 may include a portion 118P2 of the second planarization insulating layer 118, a portion 119P2 of the pixel-defining layer 119, and a portion 121P2 of the spacer 121. The first dam DM1 and the second dam DM2 may further include a portion of other layers. Some the layers described above may be optional.

Referring to FIG. 4, FIG. 5, and FIG. 6, the driving voltage supply line 60 (i.e., a power supply line) may at least partially overlap the dam DM. The driving voltage supply line 60 may extend under the first dam DM1 to the second dam DM2. The driving voltage supply line 60 may include the same material as the source electrode S and drain electrode D of the thin-film transistor TFT. The driving voltage supply line 60 may be connected to the overlying connection electrode 60a, so as to be electrically connected to the opposite electrode 230. The connection electrode 60a is disposed on the same layer and includes the same material as the contact metal 120. The driving voltage supply line 60 and the opposite electrode 230 may be directly connected to each other without the connection electrode 60a.

Referring to FIG. 4, FIG. 5, and FIG. 6, the peripheral region NDA may include the bending region BA. The bending region BA may be spaced from the first dam DM1 and the second dam DM2. The inorganic insulating layer IOL may have an opening IOL-OP corresponding to the bending region BA. A portion of the inorganic insulating layer IOL corresponding to the bending region BA may be removed in/on the bending region BA. In FIG. 6, the portion of the inorganic insulating layer IOL corresponding to the bending region BA is substantially or entirely removed. The buffer layer 111 may be partially or completely retained in/on the bending region BA. Since the portion of the inorganic insulating layer IOL in/on the bending region BA is partially or completely removed, cracks may be prevented from propagating along the inorganic insulating layer IOL when the substrate 100 is bent.

A partition wall PW may be in the bending region BA. The partition wall PW may include a portion 117P3 of the first planarization insulating layer 117, a portion 118P3 of the second planarization insulating layer 118, a portion 119P3 of the pixel-defining layer 119, and a portion 121P3 of the spacer 121. A partition wall structure in the bending region BA may be optional.

A connection line CW may be arranged in the bending region BA. The connection line CW may be a portion of a fan-out wire FW shown in FIG. 4. The fan-out wire FW may transmit a data signal to pixels via the connection line CW arranged in the bending region BA. The connection line CW may be located between a first organic layer and a second organic layer, wherein the first organic layer includes the portion 117P3 of the first planarization insulating layer 117, and the second organic layer includes the portion 118P3 of the second planarization insulating layer 118. The connection line CW may include the same material as the contact metal 120. The connection line CW may include the same material as the source electrode S of the thin-film transistor TFT, etc. A metal layer included in the connection line CW may be superior in tensile strength compared to the fan-out wire FW arranged in the peripheral region NDA excluding the bending region BA. The fan-out wire FW arranged in the peripheral region NDA excluding the bending region BA may include the same material as the gate electrode G of the thin-film transistor TFT or the second capacitor plate CE2 of the storage capacitor Cst.

Each of the first inorganic encapsulation layer 310 and the second inorganic encapsulation layer 330 of the thin-film encapsulation layer 300 may extend toward the partition wall PW. Ends of the first inorganic encapsulation layer 310 and the second inorganic encapsulation layer 330 may overlap the partition wall PW, as shown in FIG. 6. The ends of the first inorganic encapsulation layer 310 and the second inorganic encapsulation layer 330 may be disposed on the portion 118P3 of the second planarization insulating layer 118.

The ends of the first inorganic encapsulation layer 310 and the second inorganic encapsulation layer 330 may be located between the second dam DM2 and the partition wall PW. The ends of the first inorganic encapsulation layer 310 and the second inorganic encapsulation layer 330 may be disposed on the partition wall PW, e.g., on the portion 121P3 (which may be formed of the same material as the spacer 121).

Each of the first inorganic encapsulation layer 310 and the second inorganic encapsulation layer 330 of the thin-film encapsulation layer 300 may extend beyond the dam DM and may contact the inorganic insulating layer IOL. The corresponding region may be defined as the inorganic contact region ICR. No organic layer may be located between the inorganic insulating layer IOL and the thin-film encapsulation layer 300 on the inorganic contact region ICR. Therefore, potential permeation of moisture from the edge of the substrate 100 through the inorganic contact region ICR may be prevented.

Figure 7:
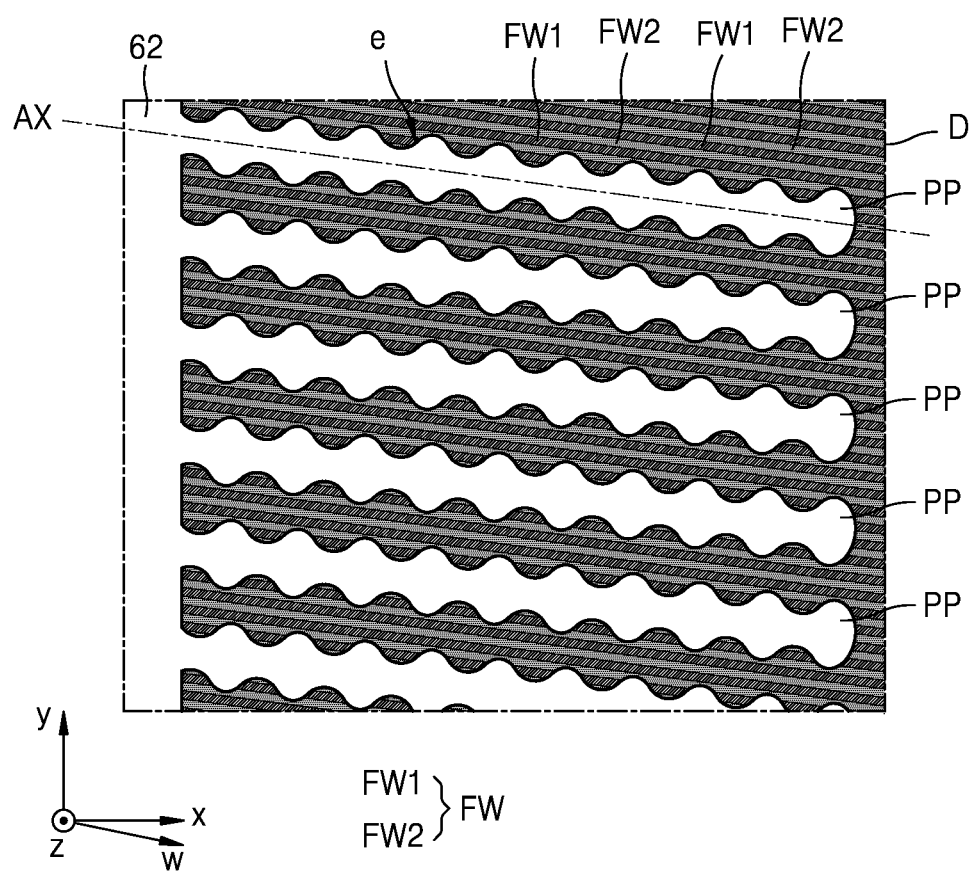
FIG. 7 is a plan view schematically illustrating region D in FIG. 5 according to an embodiment.
Figure 8:
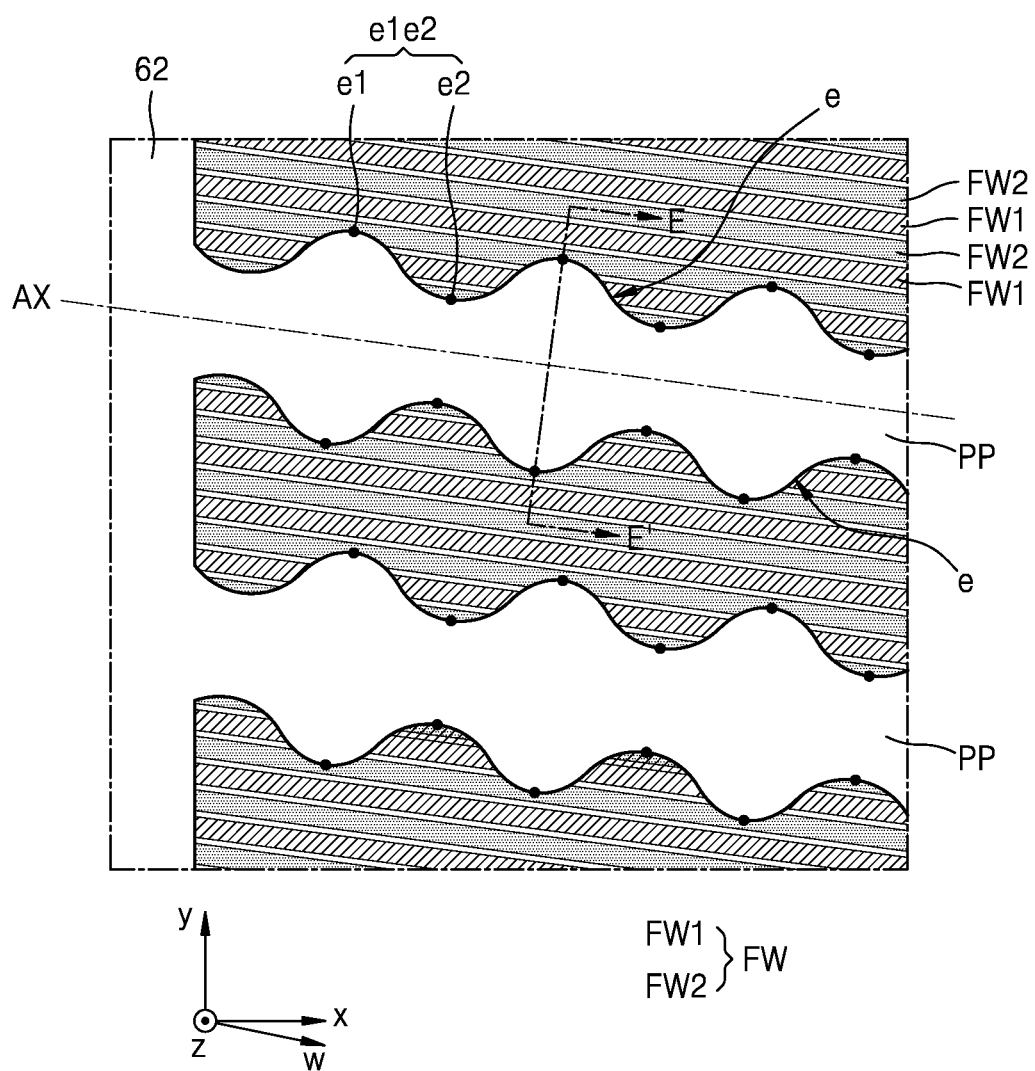
FIG. 8 is a plan view of a portion of FIG. 7 according to an embodiment.

FIG. 7 is a plan view schematically illustrating a portion of the display apparatus according to an embodiment. FIG. 8 is a plan view of a portion of FIG. 7 according to an embodiment. FIG. 7 may illustrate region D indicated in FIG. 5.

Referring to FIGS. 4, 5, 6, 7, and 8, fan-out wires FW may overlap the inorganic contact region ICR. In FIG. 5, the fan-out wires FW are not explicitly shown, for convenience of explanation. The fan-out wire FW may be arranged in the peripheral region NDA between the terminal unit 40 and the display region DA and may cross the inorganic contact region ICR.

The fan-out wires FW may include first wires FW1 and second wires FW2 alternately arranged in the y direction. A first wire FW1 and a second wire FW2 may be respectively disposed on different layers. The fan-out wire FW may include sections that extend parallel to each other near the terminal unit 40, and may include sections that diverge from each other near the display region DA. Referring to FIG. 7, sections of fan-out wires FW overlapping the inorganic contact region ICR and/or overlapping the connection line 62 may extend in a third direction (e.g., the w direction) oblique relative to the first direction (e.g., the x direction) and the second direction (e.g., the y direction). The third direction (e.g., the w direction) may be inclined at a predetermined angle relative to the first direction (e.g., the x direction).

The connection line 62 of the driving voltage supply line 60 may overlap the inorganic contact region ICR and may overlap fan-out wire FW. The fan-out wires FW may be covered by an inorganic insulating layer, and the connection line 62 may be disposed on the inorganic insulating layer. The connection line 62 may substantially extend in the second direction (e.g., the y direction) and may cross the inorganic contact region ICR.

The connection line 62 may have protrusions PP at an edge of the connection line 62. The protrusions PP may extend in the third direction (e.g., the w direction) and may extend parallel to sections of fan-out wires FW.

Each of the protrusions PP may have concave and convex edge structures e. The concave and convex edge structures e may be curved without acute angles. The concave and convex edge structures e may collectively have waveform structure a trigonometric sine waveform structure (or sine wave structure). Each protrusion PP may have concave and convex edge structures e that are symmetrically arranged at opposite sides of a first axis AX of the protrusion PP.

Referring to FIG. 8, the concave and convex edge structures e may have crests e1 and bottoms e2, which may be collectively referred to as extreme points e1e2 or vertices e1e2.

Referring to FIG. 7 and FIG. 8, the concave and convex edge structures e of a protrusion PP may include ten crests e1 and ten bottoms e2 at each of two opposite sides of the protrusion PP. The number of crests e1 and the number of bottoms e2 may be configured according to the lengths of the protrusions PP. The concave and convex edge structures e may include at least one crest e1 and at least one bottom e2. The protrusions PP may form a zipper structure.

The vertices e1e2 of each of the protrusions PP may be overlap fan-out wires FW (i.e., first wires FW1 and/or second wires FW2), but may not overlap a gap between two immediately neighboring first wire FW1 and second wire FW2.

The vertices e1e2 of a protrusion PP may all overlap first wires FW1 or second wires FW2, but may not overlap both first wires W1 and second wires W2.

Figure 9:
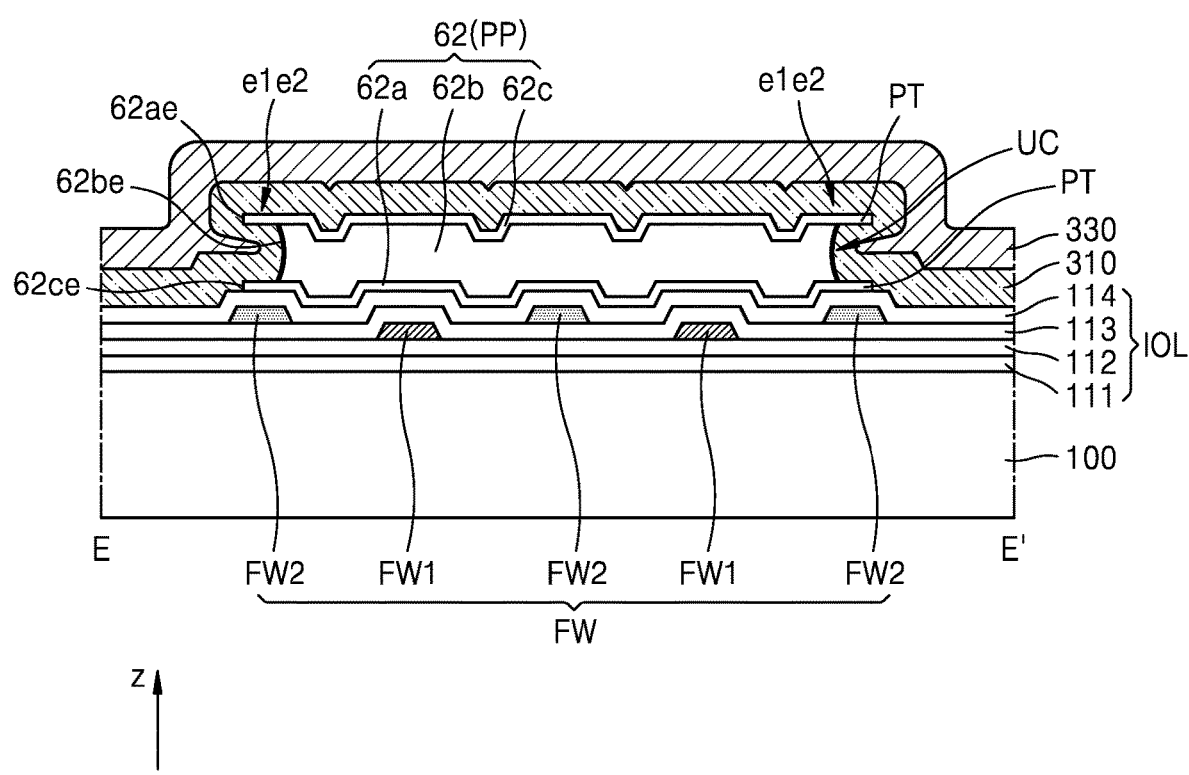
FIG. 9 is a cross-sectional view schematically illustrating a cross-section of a display apparatus taken along line E-E' in FIG. 8 according to an embodiment.
Figure 10:
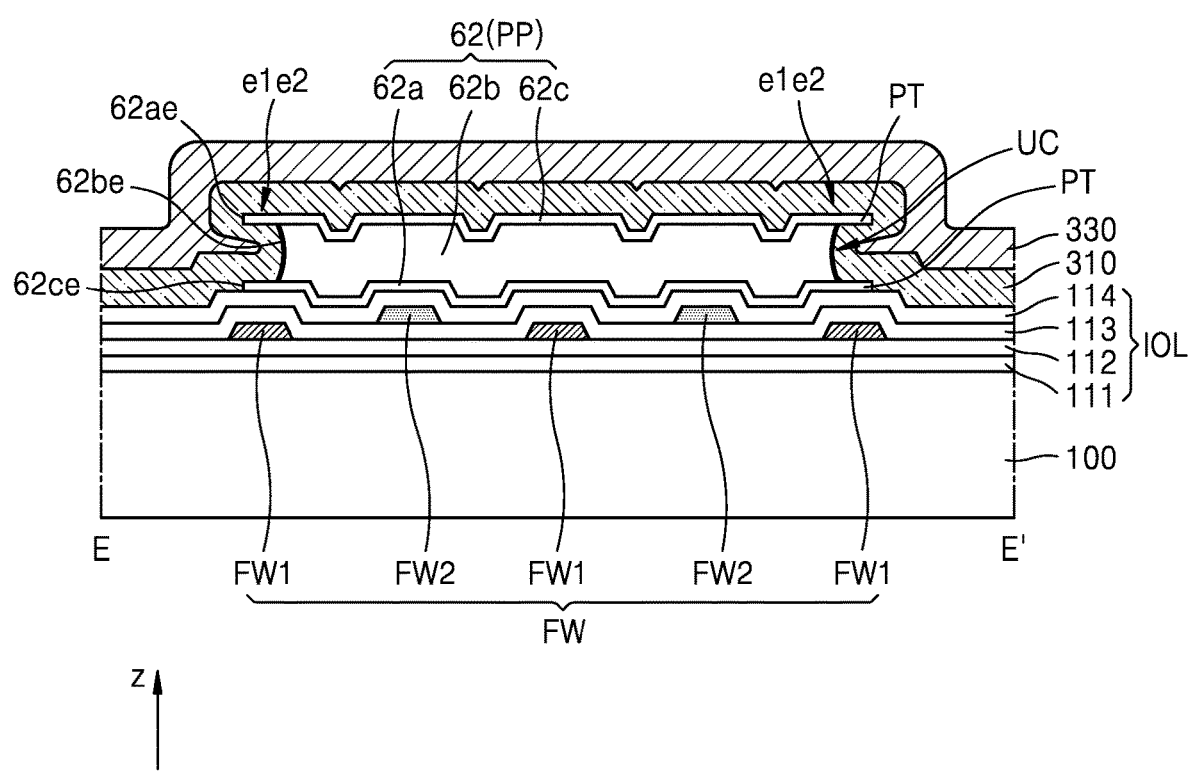
FIG. 10 is a cross-sectional view schematically illustrating a cross-section of a display apparatus taken along line E-E' in FIG. 8 according to an embodiment.

Each of FIG. 9 and FIG. 10 is a cross-sectional view schematically illustrating a portion of the display apparatus taken along line E-E' in FIG. 8 according to an embodiment.

Referring to FIG. 9, a structure corresponding to the inorganic contact region ICR is shown. The inorganic insulating layer IOL, fan-out wires FW, the first inorganic encapsulation layer 310, and the second inorganic encapsulation layer 330 may be arranged in the organic contact region ICR. The inorganic insulating layer IOL is disposed on the substrate 100. The first inorganic encapsulation layer 310 and the second inorganic encapsulation layer 330 cover the fan-out wires FW and overlap the inorganic insulating layer IOL. In FIG. 8, the thin-film encapsulation layer 300 is not explicitly shown, for convenience of explanation.

The fan-out wires FW may include first wires FW1 and second wire FW2 that are alternately arranged. A first wire FW1 and a second wire FW2 may be respectively disposed on different layers. The first wires FW1 may be disposed directly on the gate insulating layer 112, and the second wire FW2 may be disposed directly on the first interlayer insulating layer 113.

Referring to FIG. 6 and FIG. 9, the first wire FW1 may be disposed directly on the same layer as the gate electrode G of the thin-film transistor TFT, and the second wire FW2 may be disposed directly on the same layer as the second capacitor plate CE2 of the storage capacitor Cst. The expression "disposed (directly) on the same layer" may mean that the elements are simultaneously formed through the same mask process in a manufacturing process and include the same material.

The connection line 62 of the driving voltage supply line 60 may be disposed on the inorganic insulating layer IOL. The connection line 62 may extend in the second direction (e.g., the y direction) crossing the inorganic contact region ICR. FIG. 9 shows a cross-section of a protrusion PP located at an edge of the connection line 62.

The connection line 62, including the protrusion PP, may have a triple-layer structure. Both the main line 61 and the connection line 62 the driving voltage supply line 60 may have the triple-layer structure. The protrusion PP may include a first layer 62a, a third layer 62c, and a second layer 62b located between the layers 62a and 62c. The first layer 62a and the third layer 62c may include the same material, and the second layer 62b may include a material different from a material of the first layer 62a and the third layer 62c. For example, each of the first layer 62a and the third layer 62c may include Ti, and the second layer 62b may include Al.

The edge of the protrusion PP may have an undercut structure. An edge of each of the first layer 62a and the third layer 62c may have a protruding tip PT (or protruding edge portion PT) that protrudes beyond a corresponding edge of the second layer 62b. This may be due to a difference in etching rate between a metal material included in the first layer 62a and the third layer 62c and a metal material included in the second layer 62b. Because the driving voltage supply line 60 is exposed when the pixel electrode 210 or the like is formed, an edge of the driving voltage supply line 60 may be exposed to an etching solution, and thus, the structure illustrated in FIG. 9 may be formed.

The vertices e1e2 of the protrusion PP (e.g., the crests e1 illustrated in FIG. 9) may be extreme points of tips PT at edges 62ae and 62ce of the first layer 62a and the third layer 62c.

The edge of the second layer 62b may be positioned more inward than the tip PT, so that an undercut space UC (or recess UC) is provided between each of the tips PT of the first layer 62a and the third layer 62c and an edge 62be of the second layer 62b. The tips PT of the first layer 62a and the third layer 62c may be aligned in a thickness direction of the display apparatus (i.e., the +z direction).

The first inorganic encapsulation layer 310 and the second inorganic encapsulation layer 330 of the thin-film encapsulation layer 300 may entirely cover and/or fill the undercut space UC. The first inorganic encapsulation layer 310 may directly contact the tips PT of the first layer 62a and the third layer 62c and may directly contact the edge 62be of the second layer 62b. The undercut space UC may be filled by the first inorganic encapsulation layer 310 and the second inorganic encapsulation layer 330. A portion of the first inorganic encapsulation layer 310 may be positioned between the tips PT of the first layer 62a and the third layer 62c in the z direction and may fill the undercut space UC.

In a comparative example, if the vertices e1e2 overlap a gap between a first wire FW1 and a second wire FW2, the tips PT of the first layer 62a and the third layer 62c may include unwanted step structures, such that the first inorganic encapsulation layer 310 may not sufficiently fill the undercut space UC and that a significant void may exist in the undercut space UC. Moisture may permeate through the void and may cause reliability defects of elements and circuits in the display apparatus.

Since the vertices e1e2 overlap first wires FW1 or second wires FW2, the tips PT of each of the first layer 62a and the third layer 62c may be substantially flat without unwanted step structures. Therefore, the first inorganic encapsulation layer 310 and the second inorganic encapsulation layer 330 of the thin-film encapsulation layer 300 may efficiently cover and/or fill the undercut space UC. Advantageously, moisture permeation may be prevented or minimized.

FIG. 9 shows that all of the vertices e1e2 overlap second wires FW2. FIG. 10 shows that all of the vertices e1e2 overlap first wires FW1. In each FIG. 9 and FIG. 10, the tips PT of each of the first layer 62a and the third layer 62c may be substantially flat, so that the first inorganic encapsulation layer 310 may effectively cover and/or fill the undercut space UC.

Figure 12:
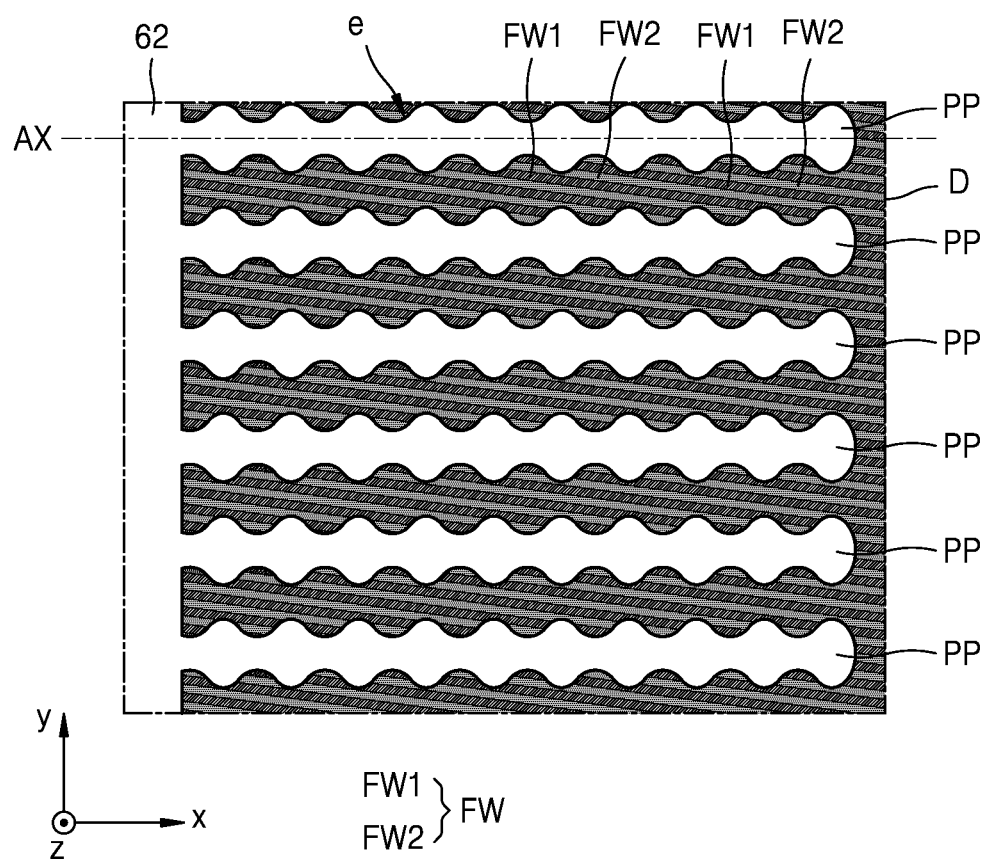
FIG. 12 is a plan view schematically illustrating a portion of a display apparatus according to an embodiment.
Figure 13:
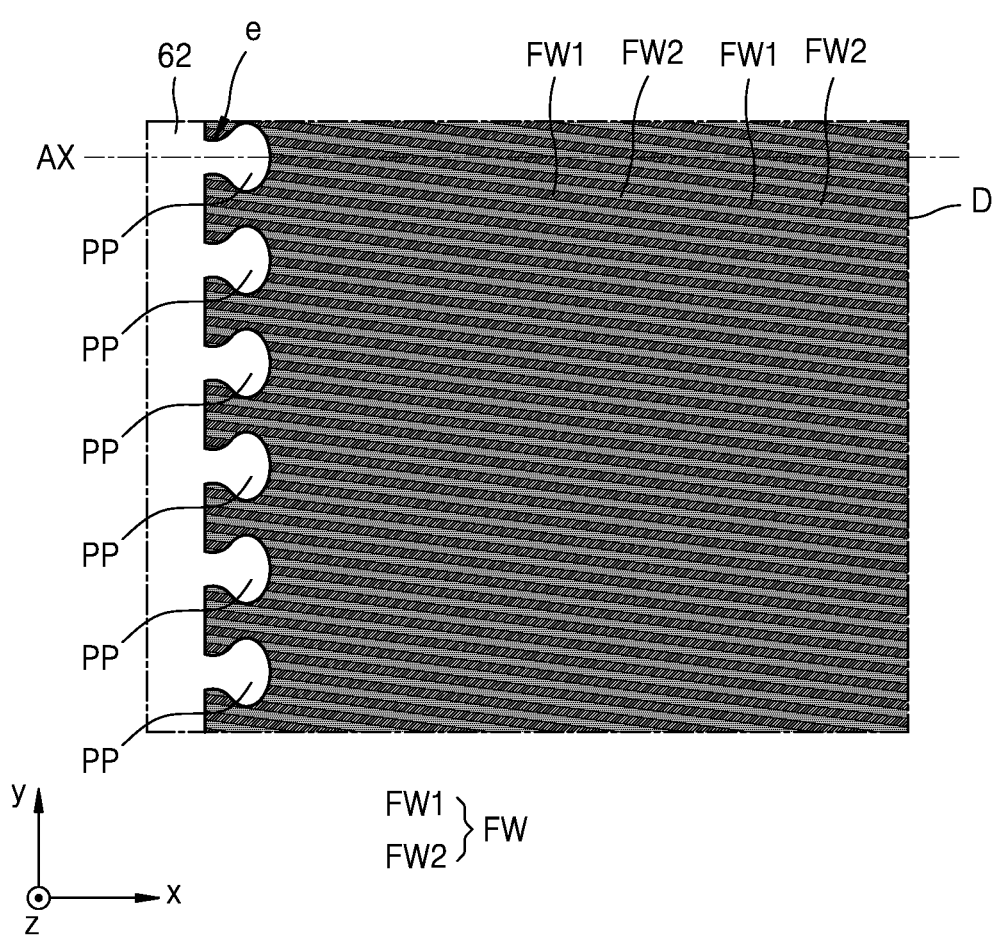
FIG. 13 is a plan view schematically illustrating a portion of a display apparatus according to an embodiment.

Each of FIG. 12 and FIG. 13 is a plan view schematically illustrating a portion of a display apparatus according to an embodiment. In FIGS. 12 and 13, the display apparatus, including the concave and convex edge structures e, may have one or more features described above with reference to one of more of FIGS. 1 to 10. Referring to FIG. 12 and FIG. 13, the concave and convex edge structures e may not be arranged in a direction parallel to a lengthwise direction of sections of fan-out wires FW. Protrusions PP may extend in the first direction (e.g., the x direction) or the second direction (e.g., the y direction). The protrusions PP may lengthen a path for moisture permeation, thus preventing or minimizing permeation of moisture.

Referring to FIG. 12, edges of each protrusion PP may have a wave structure. As shown in FIG. 13, protrusions PP may form a zipper structure. The shapes, arrangements, and lengthwise directions the protrusions PP may be configured according to particular embodiments.

Figure 11:
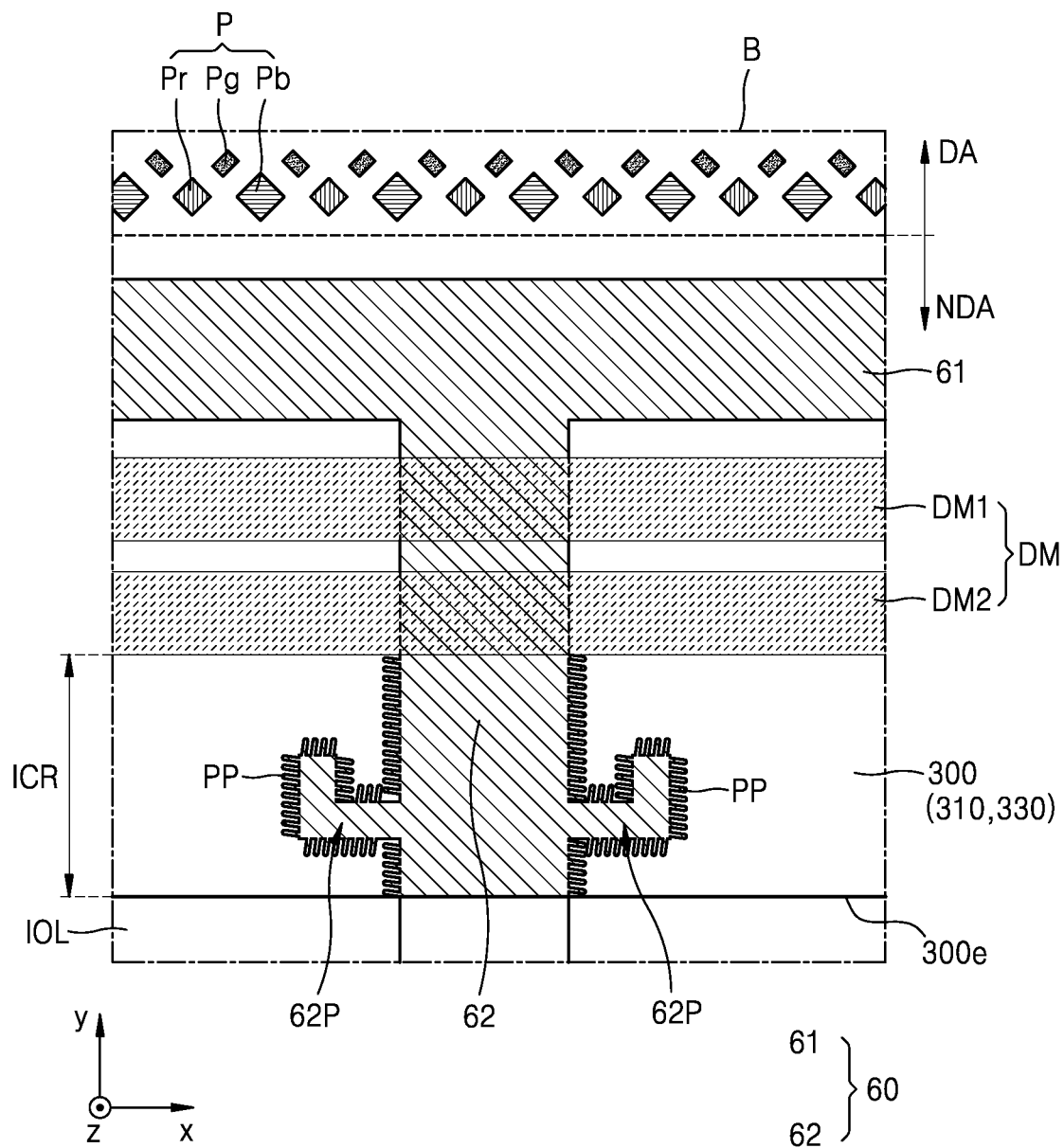
FIG. 11 is a plan view schematically illustrating a portion of a display apparatus according to an embodiment.

FIG. 11 is a plan view schematically illustrating a portion of a display apparatus according to an embodiment.

The display apparatus associated with FIG. 11 may have features described with reference to one of more of FIGS. 1 to 10, 12, and 13.

Referring to FIG. 11, a portion of the connection line 62 of the driving voltage supply line 60 arranged in the inorganic contact region ICR may include a bent portion 62p extending toward the display region DA. The bent portion 62p may extend/protrude outward from an edge of the connection line 62. In FIG. 11, the bent portion 62p may have an "L" shape including one bend. The bent portion 62p may include two or more bends.

Protrusions PP may be arranged at an edge of the bent portion 62p. The protrusions PP may form a zipper structure, and may have features described above.

The bent portion 62p with the protrusions PP may significantly lengthen a path for moisture permeation. Advantageously, permeation of moisture may be effectively prevented.

Embodiments may be related to a method for manufacturing a display apparatus. The display apparatus may have satisfactory resistance against moisture permeation.

The described embodiments should be considered in an illustrative sense and not for purposes of limitation. Descriptions of features or aspects within each embodiment should typically be considered as available for other similar features or aspects in other embodiments. While embodiments have been described with reference to the figures, various changes in form and details may be made in the described embodiments without departing from the scope defined by the following claims.

What is claimed is:

1. A display apparatus comprising:
a substrate having a display region;
a display element arranged on the display region;
an inorganic insulating layer arranged between the substrate and the display element;
a first inorganic encapsulation layer including a contact region that directly contacts the inorganic insulating layer;
a dam surrounding the display region and including a dam section that is arranged between the display region and the contact region;
a first wire crossing the dam and configured to transmit a first signal toward the display region; and
a power supply line crossing the dam, overlapping the first wire, and including protrusions,
wherein the protrusions protrude from an edge of the power supply line and overlap the contact region.

2. The display apparatus of claim 1, wherein the power supply line comprises a main line extending in a first direction and comprises a connection line extending in a second direction different from the first direction, and
wherein each of the protrusions extends in a third direction different from each of the first direction and the second direction.

3. The display apparatus of claim 2, wherein the protrusions include a protrusion, and wherein an edge of the protrusion comprises convex structures and concave structures that are alternately arranged in the third direction.

4. The display apparatus of claim 3, wherein the convex structures each have a curved edge.

5. The display apparatus of claim 4, further comprising: a second wire overlapping the power supply line, crossing the dam, configured to transmit a second signal toward the display region, and positioned farther from or closer to the substrate than the first wire,
wherein extreme points of the convex structures overlap exactly one of the first wire and the second wire.

6. The display apparatus of claim 5, wherein the second wire is positioned farther from the substrate than the first wire, and wherein the extreme points of the concave structures overlap the second wire.

7. The display apparatus of claim 5, wherein each of the first wire and the second wire extends in the third direction.

8. The display apparatus of claim 1, wherein the power supply line is disposed on the inorganic insulating layer and directly contacts the contact region.

9. The display apparatus of claim 8, wherein the protrusions direct contact the contact region.

10. The display apparatus of claim 8, wherein the dam section is positioned between a main line of the power supply line and the protrusions.

11. The display apparatus of claim 1, wherein the power supply line comprises a first layer, a third layer, and a second layer located between the first layer and the third layer, the first layer and the third layer comprising a same material.

12. The display apparatus of claim 11, wherein the first layer and the third layer each comprise titanium (Ti), and wherein the second layer comprises aluminum (Al).

13. The display apparatus of claim 11, wherein each of an edge portion of the first layer and an edge portion of the third layer protrudes beyond a surface of the second layer in a direction parallel to the substrate.

14. The display apparatus of claim 13, wherein a recess exists between the edge portion of the first layer and edge portion of the third layer, between the edge portion of the first layer and the surface of the second layer, and between the edge portion of the third layer and the surface of the second layer.

15. The display apparatus of claim 14, wherein the first inorganic encapsulation layer fills the recess.

16. The display apparatus of claim 15, wherein the first inorganic encapsulation layer directly contacts the surface of the second layer.

17. The display apparatus of claim 1, further comprising:
a thin-film transistor comprising a semiconductor layer, a gate electrode, and an electrode layer, wherein the gate electrode overlaps the semiconductor layer, and wherein the electrode layer is electrically connected to the semiconductor layer; and
a connection metal disposed over the thin-film transistor and electrically connected to the electrode layer,
wherein the power supply line comprises a same material as at least one of the electrode layer and the connection metal.

18. The display apparatus of claim 17, further comprising:
a second wire overlapping the power supply line, crossing the dam, configured to transmit a second signal toward the display region, and positioned farther from or closer to the substrate than the first wire; and
a capacitor electrode overlapping the gate electrode,
wherein a material of the first wire is identical to a material of the gate electrode, and
wherein a material of the second line is identical to a material of the capacitor electrode.

19. The display apparatus of claim 1, wherein the power supply line comprises a bent structure overlapping the contact region and bent toward the display region.

20. The display apparatus of claim 19, wherein the protrusions protrude from an edge of the bent portion.

21. A display device comprising:
a substrate having a display region;
a display element arranged on the display region;
an inorganic insulating layer arranged between the substrate and the display element;

a first inorganic encapsulation layer including a contact region that directly contacts the inorganic insulating layer;

a first wire configured to transmit a first signal toward the display region; and a power supply line overlapping a section of the first wire and comprising protrusions, wherein the protrusions protrude from an edge of the power supply line, extend oblique relative to the edge of the power supply line, extend parallel to the section of the first wire, and overlap the contact region.

22. The display apparatus of claim 21, further comprising: a dam surrounding the display region and including a section positioned between the display region and the contact region.

23. The display apparatus of claim 21, wherein the protrusions include a protrusion, wherein the protrusion comprises convex structures and concave structures that are alternately arranged in a direction parallel to the section of the first wire.

24. The display apparatus of claim 23, wherein vertices of the convex structures overlap the section of the first wire.

25. The display apparatus of claim 24, further comprising: a second wire spaced from the first wire and configured to transmit a second signal toward the display region, wherein vertices of the concave structures overlap the second wire.

26. The display apparatus of claim 21, wherein the power supply line comprises a first layer, a third layer, and a second layer located between the first layer and the third layer, the first layer and the third layer comprising a same material.

27. The display apparatus of claim 26, wherein each of an edge portion of the first layer and an edge portion of the third layer protrudes beyond an edge of the second layer in a direction parallel to the substrate.

* * * * *